(12) United States Patent
Sogard et al.

(10) Patent No.: US 9,529,282 B2
(45) Date of Patent: Dec. 27, 2016

(54) POSITION-MEASUREMENT SYSTEMS (71) Applicant: Nikon Corporation, Chiyoda-ku, Tokyo (JP)

(72) Inventors: Michael R. Sogard, Menlo Park, CA (US); Motofusa Ishikawa, Ageo (JP)

(73) Assignee: Nikon Corporation, Tokyo (JP)

( * ) Notice: Subject to any disclaimer, the term of this patent is extended or adjusted under 35 U.S.C. 154(b) by 195 days.

(21) Appl. No.: 14/261,135

(22) Filed: Apr. 24, 2014

(65) Prior Publication Data

US 2014/0320832 A1    Oct. 30, 2014

Related U.S. Application Data (60) Provisional application No. 61/815,999, filed on Apr. 25, 2013.

(51) Int. Cl.
| | |
|---|---|
| G03B 27/42 | (2006.01) |
| G03F 7/20 | (2006.01) |
| G01B 13/12 | (2006.01) |

(52) U.S. Cl.
CPC ............. *G03F 7/7085* (2013.01); *G01B 13/12* (2013.01)

(58) Field of Classification Search
CPC .. G03F 7/7085; G03F 7/70775; G03F 9/7057; G03F 9/7026; G01B 13/12
USPC .......................................................... 355/53
See application file for complete search history.

(56) References Cited

U.S. PATENT DOCUMENTS

| | | | |
|---|---|---|---|
| 4,607,525 A | 8/1986 | Turner et al. | |
| 4,650,983 A | 3/1987 | Suwa | |
| 4,953,388 A | 9/1990 | Barada | |
| 5,540,082 A | 7/1996 | Okuyama et al. | |
| 5,789,661 A | 8/1998 | Fauque et al. | |
| 6,978,658 B1 * | 12/2005 | Kochersperger | ....... G01B 13/12 73/37.5 |
| 6,989,922 B2 | 1/2006 | Phillips et al. | |
| 7,437,911 B2 | 10/2008 | Galburt et al. | |
| 7,797,985 B2 | 9/2010 | Galburt et al. | |
| 2006/0123888 A1 * | 6/2006 | Galburt | .................. G01B 13/02 73/37.5 |
| 2009/0116039 A1 | 5/2009 | Hidaka | |
| 2011/0086315 A1 | 4/2011 | Ichinose | |
| 2011/0157576 A1 | 6/2011 | Sogard | |
| 2013/0211777 A1 | 8/2013 | Sogard | |

FOREIGN PATENT DOCUMENTS

WO    WO 2013022892 A1 *    2/2013    ......... G02B 26/0816

* cited by examiner

*Primary Examiner* — Peter B Kim (74) *Attorney, Agent, or Firm* — Klarquist Sparkman, LLP (57) ABSTRACT

Apparatus are disclosed for measuring the position of an object surface along an axis. An exemplary apparatus has at least one actuator coupled to a fixed member such as a metrology frame. At least one analog proximity sensor is coupled to the at least one actuator. The at least one actuator is controllably operated to position the at least one proximity sensor at a fixed distance along the axis from a surface that is fixed relative to the fixed me+mber. A controller, coupled to the actuator and to the proximity sensor, is configured to compute a position of the object surface along the axis based on a known location of the fixed surface along the axis, the fixed distance from the fixed surface, and position signals from the at least one proximity sensor.

24 Claims, 9 Drawing Sheets

POSITION-MEASUREMENT SYSTEMS

CROSS-REFERENCE TO RELATED APPLICATION

This application claims priority to and the benefit of U.S. Provisional Application No. 61/815,999, filed on Apr. 25, 2013, which is incorporated herein by reference in its entirety.

BACKGROUND

This disclosure pertains to, inter alia, devices for use in determining and/or monitoring position of a workpiece in a precision system such as, but not limited to, a system for microlithographically exposing a micro-pattern onto an exposure-sensitive substrate.

Various types of microlithographic exposure systems are currently in use for imprinting micro-patterns onto the surfaces of substrates such as semiconductor wafers. A typical microlithographic exposure system includes an illumination source, a first stage apparatus that holds and positions a pattern master (e.g., a reticle), a second stage apparatus (downstream of the first stage apparatus) that holds and positions the substrate, an imaging optical system situated between the first and second stage apparatus, and a control subsystem connected to and exercising operational control over these apparatus and subsystems. Since the sizes of the pattern elements are very small (now in the several tens of nanometers), the first and second stage apparatus must be capable, as controlled by the control subsystem, of achieving extremely accurate and precise positioning of the stage apparatus and imaging optical system relative to each other so as to achieve corresponding highly accurate exposures.

Substantially all microlithographic exposure systems currently in use employ various sensors, detectors, and other measurement devices for determining and monitoring the accuracy and precision of stage position and of many other operations performed by the exposure system. An example use of sensors and detectors is in devices for performing auto-focus of the imaging performed by the imaging optical system. Auto-focus involves accurate and precise placement of the reticle and substrate relative to the imaging optical system so that exposures made on the wafer have a specified imaging resolution.

For use in auto-focus devices, fluid gauges have been considered for use, either alone or in cooperation with other devices such as slit-projection sensors as described in U.S. Pat. No. 4,650,983. A first conventional example of such a device, called an "air gauge," is discussed in U.S. Pat. No. 4,953,388, in which the device is configured as a pneumatic bridge. The device includes an air source, from which an air conduit is split to form a measurement arm and a reference arm. Each arm has a respective "probe" from which air is discharged onto a surface. For the measurement arm the surface is that of a workpiece. For the reference aim the surface is part of the gauge and is at a fixed distance from the respective probe. A mass-flow controller is connected between the arms to detect changes in air flow between the two arms resulting from a change in gap distance from the measurement probe to the surface of the workpiece. U.S. Pat. No. 5,540,082 discusses other conventional air gauges used for determining and monitoring position of a workpiece. Both the U.S. Pat. Nos. 5,540,082 and 4,953,388 patent documents are incorporated herein by reference in their respective entireties.

Rather than using a mass-flow controller for determining differential flow of air to the two arms of an air-gauge, a differential pressure sensor can be used. Also, the reference probe can be replaced with a controlled air-bleed device. Changes in gap distance are thus inferred from changes in the mass flow or pressure difference between the measurement and reference arms.

Further disclosures of air gauges and the like are in U.S. Patent Publication No. 2011/0157576 and U.S. patent application Ser. No. 13/753,754, both incorporated herein by reference in their respective entireties to the maximum extent allowed by law.

Air gauges typically respond in a non-linear fashion as the measurement gap changes. This makes calibration of air gauges difficult. In some applications the stage, or the air gauge position, is servoed to keep the measurement gap constant and to minimize any non-linearities. Alternatively, the measurement gap can be servoed to keep the air flows in the measurement and reference arms balanced, so that no change occurs in the differential mass flow or differential pressure. Servoed systems are described in U.S. Pat. Nos. 7,437,911 and 7,797,985, both incorporated herein by reference to the fullest extent allowed by law.

In some applications, it can be difficult with fluid gauges as summarized above to achieve adequate servo-control of the probe(s) due to the complexity of the gauges and of the complexity of the control procedures. For example, complexity is due in part to the fact that the fluid gauge includes at least two air flows (in the measurement arm and at least one reference arm) that must be controlled and/or measured.

SUMMARY

These issues are addressed by various embodiments, including those disclosed herein, of apparatus and methods for measuring the height or other position of an object (such as a lithographic substrate) in a precision system (e.g., microlithography system) with high accuracy and precision using simple control systems. Position is typically measured along an axis, which can be a vertical axis (z-axis), on or along which the object is disposed, but the embodiments are not limited to determining object position with respect to a vertical axis. Positional measurements are obtained in part using at least one analog proximity sensor. An exemplary analog proximity sensor is an air gauge. The analog proximity sensor is associated with an actuator. Under control of a controller coupled to the proximity sensor and actuator, the actuator moves the proximity sensor along the axis as required for positioning the proximity sensor a fixed distance from a known fixed (stationary) surface, such as a surface of or a surface associated with the metrology frame of the precision system. Substrate height is computed from: (a) the known position of the fixed surface on the axis, (b) the fixed distance from the surface, and (c) a position signal produced by the proximity sensor.

Hence, in the context of a precision system having a fixed metrology member, apparatus are provided for measuring position of an object surface along an axis. An embodiment of the apparatus comprises at least one actuator coupled to the fixed metrology member, at least one analog proximity sensor coupled to the at least one actuator, and a controller coupled to the actuator and proximity sensor. The at least one actuator is controllably operated to position the at least one proximity sensor at a fixed distance along the axis from a surface that is fixed relative to the fixed metrology member. The controller is coupled to the actuator and to the proximity sensor. The controller is configured to compute a position of the object surface along the axis, based on a known location of the fixed surface along the axis, the fixed distance from the fixed surface, and position signals from the at least one proximity sensor.

The foregoing and additional features and advantages of the invention will be more readily apparent from the following detailed description, which proceeds with reference to the accompanying drawings.

BRIEF DESCRIPTION OF THE DRAWINGS

FIG. 7 schematically depicts an alternative embodiment to that of FIG. 6.

DESCRIPTION

This disclosure is set forth in the context of representative embodiments that are not intended to be limiting in any way.

The drawings are intended to illustrate the general manner of construction and are not necessarily to scale. In the detailed description and in the drawings themselves, specific illustrative examples are shown and described herein in detail. It will be understood, however, that the drawings and the detailed description are not intended to limit the invention to the particular forms disclosed, but are merely illustrative and intended to teach one of ordinary skill how to make and/or use the invention claimed herein.

As used in this application and in the claims, the singular forms "a," "an," and "the" include the plural forms unless the context clearly dictates otherwise. Additionally, the term "includes" means "comprises." Further, the term "coupled" encompasses mechanical as well as other practical ways of coupling or linking items together, and does not exclude the presence of intermediate elements between the coupled items.

This disclosure is directed toward all novel and non-obvious features and aspects of the various disclosed embodiments, alone and in various combinations and sub-combinations with one another. The disclosed things and methods are not limited to any specific aspect or feature or combinations thereof, nor do the disclosed things and methods require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed things and methods can be used in conjunction with other things and method. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

Any mention herein of a controller or processor referred to in the singular will be understood to encompass use of multiple controllers or processors.

In the following description, certain terms may be used such as "up," "down,", "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object.

If a figure includes a positional designation that includes respective coordinates along an x-axis, along a y-axis that is orthogonal to the x-axis, and along a z-axis that is orthogonal to both the x- and y-axes, it should be noted that any of these axes can also be referred to as the first, second, and/or third axes.

For concreteness, the following disclosure is made in the context of a microlithography system, as an exemplary precision system, in which the position, on a height axis for example, of a lithographic substrate is measured using an air gauge or other fluid gauge. A typical modern microlithography system includes a "metrology frame" to which, or relative to which, various sensors and other vibration-sensitive components are mounted for stability and protection from extraneous hazards such as vibration. Thus, the metrology frame can provide positional references that are accurately known and that are stable.

Various embodiments and examples of systems described below utilize at least one "analog proximity device" for determining substrate height. An example of an analog proximity device is an air gauge. A particularly suitable air gauge comprises: (a) a supply of pressurized air or other gas, (b) a nozzle or "probe" that discharges a "measurement" stream of air across a gap to the substrate surface, (c) at least one reference stream, (d) a pneumatic module defining channels and including respective air-flow restrictor(s) that provide controlled flows of air to the measurement stream and reference stream(s), and (e) a respective differential-pressure sensor or mass-flow sensor connected between the measurement stream and each reference stream.

Figure 1:
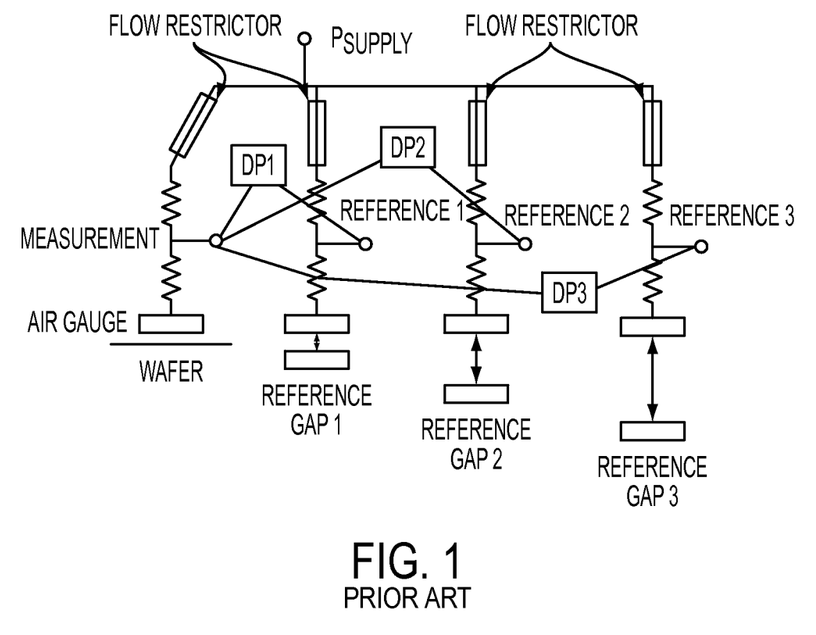
FIG. 1 is a schematic diagram of an air gauge having three reference streams and one measurement stream. The probe is situated at the distal end of the measurement stream.

By way of example, FIG. 1 is a schematic diagram of an air gauge having three reference streams and one measurement stream. The probe is situated at the distal end of the measurement stream. The reference streams terminate at respective gaps or otherwise perform controlled discharges of respective shares of air supplied to them, so as to establish respective reference pressures ("reference 1," "reference 2," and "reference 3"). The reference channels are arranged in parallel. Associated with the measurement stream are three respective differential pressures ("$DP_1$," "$DP_2$," and "$DP_3$") that correlate to the respective references 1, 2, and 3. Thus, air flow to this gauge is divided between a measurement subsystem (providing a controlled flow of air to the probe) and a reference subsystem (directing respective controlled flows of air to the reference streams). The flow of air in the reference streams is controlled by respective flow-restrictors. Air passing through each stream exhausts to the atmosphere. A respective differential-pressure sensor or mass-flow sensor connects between the measurement stream and each reference stream. During operation, the variable flow-restrictors are adjusted so that at least one differential-pressure sensor produces a reading of approximately zero whenever the probe is in the middle of a normal range of substrate heights to be measured.

To avoid damage, the air gauge or portion thereof is retracted a significant distance (in units of mm, for example) relative to (e.g., above) the substrate whenever the gauge is not being used. This retraction is performed by an actuator such as, but not limited to, a piezoelectric actuator or voice-coil motor (VCM). When use of the air gauge is needed, the actuator moves (e.g., lowers) the gauge toward the substrate to a "use" position that is fixed relative to the metrology frame. The fixed position of the air gauge in the "use" position can be determined by measuring the height, relative to the metrology frame, of a dedicated location on the air gauge. This measurement can be performed using, e.g., a capacitance ("cap") sensor, encoder, interferometer, or optical proximity sensor. The substrate height is determined from data concerning the height of the dedicated location on the air gauge and from the substrate-height data produced by the air gauge itself. For stability, after it has positioned the air gauge, the actuator can be locked in place. Thus, the metrology frame can serve as a positional reference for the air gauge, at least during use of the air gauge.

Measurements of the respective heights, relative to the metrology frame, of multiple dedicated locations on the air gauge may be used to determine the angular orientation of the probe, especially $\theta_X$ (rotation about the X-axis) and $\theta_Y$ (rotation about the Y-axis). Certain embodiments described below include features that minimize or eliminate variations of the angular orientation of the probe. (See, for example, the third embodiment.)

Figure 2A:
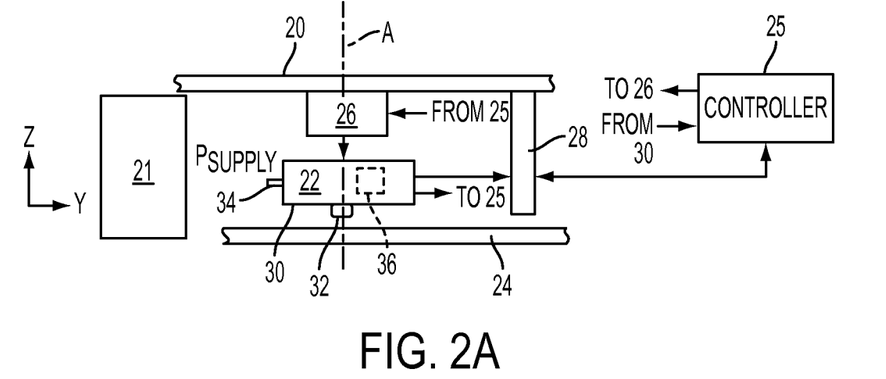
FIG. 2A is a schematic diagram of a first embodiment of a position-measurement apparatus that is particularly configured for use, in a microlithography system, in measuring height (position in the Z-direction) of a lithographic substrate ("wafer") relative to a projection lens.
Figure 2B:
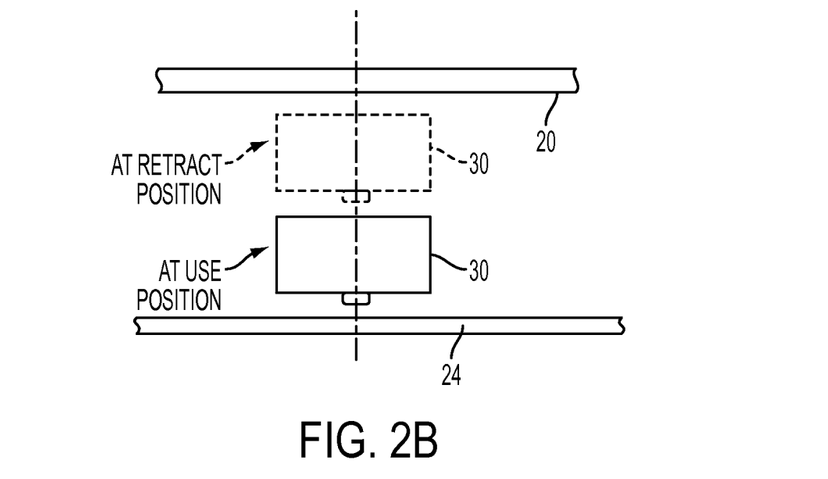
FIG. 2B schematically shows example "use" and "retract" positions of the air gauge of FIG. 2A.

A first embodiment of a position-measurement apparatus is shown in FIG. 2A. The apparatus is particularly configured for use, in a microlithography system, in measuring height (position in the Z-direction) of a lithographic substrate ("wafer") 24 relative to a projection lens 21. The apparatus includes a metrology frame 20, of which a horizontal member is shown, that serves as a positional reference, in at least the height direction, for certain components of the microlithography system. The apparatus includes an air gauge 22 as an exemplary analog proximity sensor. For use in measuring height of the wafer 24 relative to the projection lens 21, the air gauge 22 is positioned in a "use" position relative to (but not in contact with) the wafer 24 (See FIG. 2B). Mounted to the metrology frame 20 are an actuator 26 and a height encoder 28. The air gauge 22 is coupled to the actuator 26, and the height encoder 28 measures the height of the air gauge 22. An exemplary actuator 26 is a piezoelectric actuator or voice-coil motor. The actuator 26 moves the air gauge 22, relative to the metrology frame 20, along the axis A toward the wafer 24 (vertically downward in the figure) to the "use" position whenever the air gauge 22 is to be used for measuring height of the wafer 24 during lithographic exposure of the wafer. The actuator 26 also moves the air gauge 22 away from the wafer 24 to a "retract" position (FIG. 2B) whenever the air gauge is not actually being used for measuring wafer height. During these motions, the height encoder 28 measures the height of the air gauge 22 relative to the metrology frame 20. For monitoring and controlling these motions, the height encoder 28 is coupled to a controller 25. The air gauge 22 in this embodiment includes a "pneumatic module" 30, which in this embodiment includes a probe 32, an inlet 34 connected to a source ($P_{supply}$) of pressurized air, and a DP sensor 36.

The air gauge comprises a measurement arm and at least one reference arm. Thus, the air gauge can include multiple reference arms, as exemplified by certain embodiments.

With the metrology frame 20 being fixed relative to the projection lens 21, the height encoder 28 allows the air gauge 22 to be positioned at a known height relative to the projection lens, after an initial calibration. The pneumatic module 30 determines static pressures and mass flow in the air gauge 22.

Figure 3:
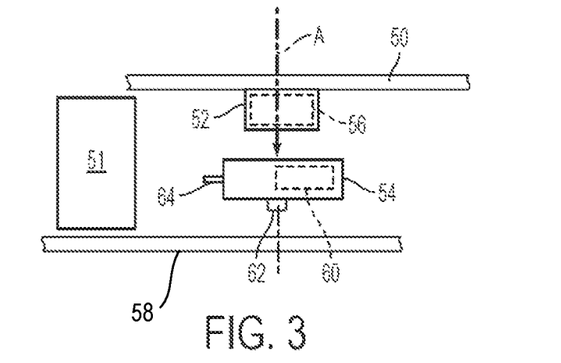
FIG. 3 is a schematic diagram of a second embodiment of a position-measurement apparatus in the context of a microlithography system including a metrology frame that is fixed relative to the projection lens.

A second embodiment usable in a microlithography system is shown in FIG. 3, depicting a metrology frame 50 that is fixed relative to the projection lens 51. To the metrology frame 50 are mounted an actuator 52 and an air gauge 54. The actuator 52 moves the air gauge 54 relative to the metrology frame 50 from a retracted position (upward in the figure) to a "use" position (downward in the figure). The actuator 52 includes an internal actuator-extension monitor 56, which allows the air gauge 54 to be positioned accurately in the height direction relative to the projection lens 51 (e.g., an accuracy within <1 µm), particularly whenever the air gauge 54 is being positioned for use. The measured height of the air gauge 54 in the use position is calibrated against a height standard before each wafer 58 is exposed. As in the first embodiment, the air gauge 54 includes a DP sensor 60, a probe 62, and an inlet 64 for pressurized air.

The respective actuators used in the first and second embodiments are generally termed "position actuators" that move the respective air gauges by predetermined displacements. When using an actuator in this manner, it is desirable to use a height encoder to monitor the displacements of the air gauge and make them reproducible. However, this manner of using position actuators does not account for accuracy-degrading influences such as thermal effects in either the actuator or the air gauge, resulting in possible difficulty in achieving desired reproducibility of height readings.

Figure 4A:
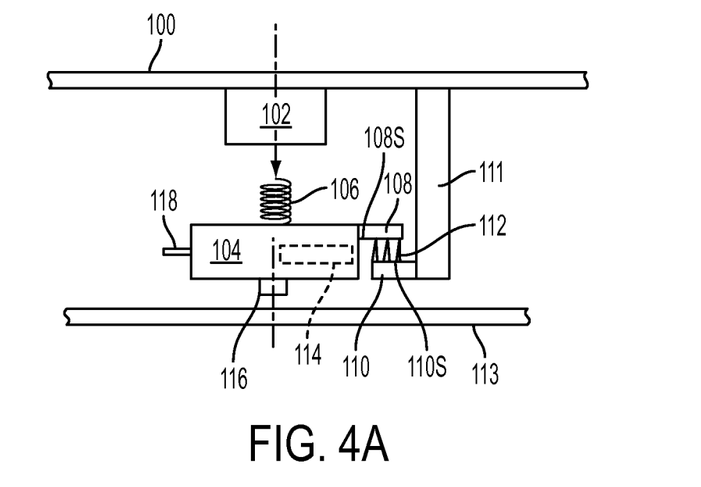
FIG. 4A is a schematic diagram of a third embodiment configured to ensure repeatable positioning of the air gauge at a "use" position with high accuracy. The air gauge can comprise multiple extensions and multiple corresponding frame extensions that collectively prevent tilting of the air gauge at the "use" position. Specifically shown are extensions that prevent rotation of the air gauge about the X axis ($\theta_X$ tilts).

A third embodiment is shown in FIG. 4A, which provides a partial solution to the accuracy-degrading issue noted above. This embodiment includes a fixed metrology frame 100. Mounted to the metrology frame 100 is an actuator 102 (e.g., a piezoelectric actuator) that moves the air gauge 104 on command relative to the metrology frame 100. The actuator 102 urges this motion via a compression spring 106 or the like. The combination of the actuator 102 and spring 106 is a so-called "force actuator" that allows the air gauge 104 to be positioned repeatedly at a known height relative to the projection lens (after an initial calibration) without having to use a height encoder. The force actuator works cooperatively with a positive stop that prevents motion (downward in the figure) of the air gauge 104 past a "use" position. In particular, motion of the air gauge past the use position is prevented by interaction of the surface 108s of an extension 108 of the air gauge 104 against the surface 110s of a corresponding extension 110 of the metrology frame 100 (or rigidly affixed to the metrology frame). The extensions 108, 110 provide a positive stop for the air gauge in the use position, and hence serve as a positional reference for the air gauge 104 whenever the presence of the air gauge at the use position (also called "measurement position") is desired. In addition, via the spring 106, the actuator 102 applies a controlled force to the air gauge 104; thus, when the actuator 102 moves the air gauge 104 to the use position, the extensions 108, 110 are urged with the same force each time against each other. This controlled force results in a reproducible compression and distortion of the frame extension 110 and of the air-gauge extension 108, and thus provides a repeatable positioning of the air gauge 104 at a known height relative to a surface of a wafer 113, after an initial calibration. The frame extension 110 is mounted to the metrology frame via a member 111 that can include an air-gauge height encoder (not shown) if desired (but a height encoder is not required if relying on the extensions 108, 110 to position the air gauge 104 in the use position).

Temperature changes in one or both extensions 108, 110 or in the air gauge can still create height errors from thermal expansion or contraction. These errors can be corrected by monitoring the temperature of these components using temperature sensors and applying a correction based on previous calibrations.

Figure 4B:
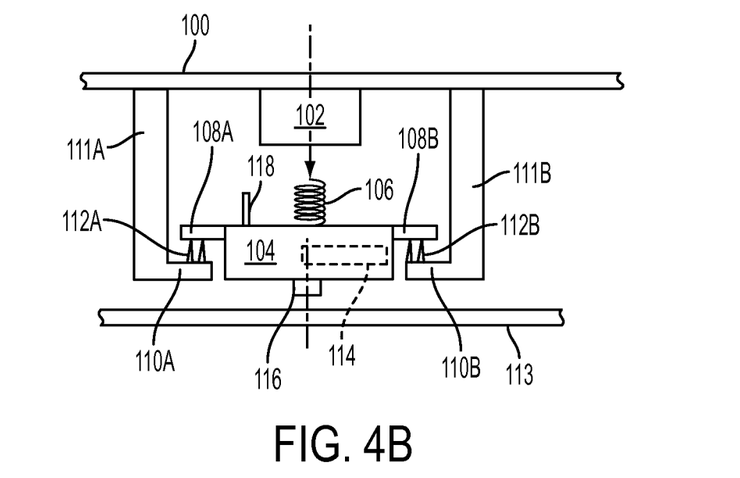
FIG. 4B is a schematic diagram of a fourth embodiment configured to ensure repeatable positioning of the air gauge at the use position with high accuracy. To such end, the air gauge comprises multiple extensions and multiple corresponding frame extensions that collectively prevent tilting of the air gauge at this location. The depicted extensions prevent rotation of the air gauge about the X axis ($\theta_X$ tilts) and about the Y axis ($\theta_Y$ tilts).

To further ensure repeatable positioning of the air gauge at the use-position stop with high accuracy, the air gauge 104 can comprise multiple extensions 108A, 108B (FIG. 4B) and multiple corresponding frame extensions 110A, 110B that collectively prevent tilting of the air gauge at this location. FIG. 4A shows extensions that prevent rotation of the air gauge about the X axis (i.e., $\theta_X$ tilts). Another set of extensions 108, 110 can be provided to also prevent rotation of the air gauge about the Y axis (i.e., $\theta_Y$ tilts). To avoid possible position errors caused by particulate contamination of respective surfaces of the extensions 108, 110 that contact each other, at least one of the contacting surfaces can have multiple pins 112 (such as those of a pin chuck, for example) to minimize the contact area. The entire air gauge 104 is movable in this embodiment, and includes a DP sensor 114, a probe 116, and an inlet 118 for pressurized air. The air gauge 104 also includes components that determine static pressures and mass flow.

Figure 5:
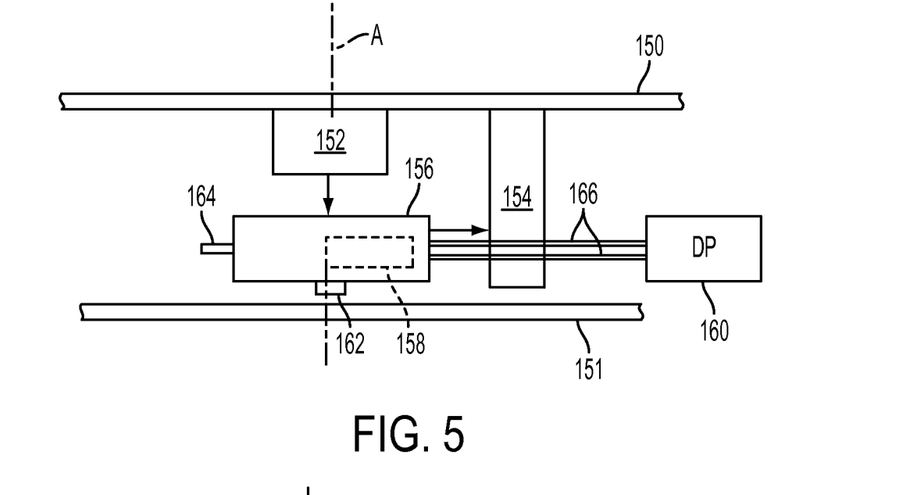
FIG. 5 is a schematic diagram of a fifth embodiment including a modular air gauge.

In the embodiments described above, the entire air gauge is moved (e.g., toward the substrate to the use position or away from the substrate to a retract position). In other embodiments the air gauge is modular, with at least one movable portion and at least one stationary portion. In a first exemplary embodiment including a modular air gauge, reference is made to FIG. 5, in which is shown the metrology frame 150 and actuator 152 mounted thereto. Also mounted to the metrology frame 150 is an air-gauge height encoder 154. The air gauge 156 in this embodiment comprises a pneumatic module 158 and a separate DP sensor 160. The DP sensor 160 is the stationary portion of the air gauge 156, and the pneumatic module 158 is the movable portion. The pneumatic module 158 includes the probe 162, disposed relative to the wafer 151, and inlet port 164. The DP sensor 160 is coupled to the pneumatic module 158 via flexible conduits 166 that allow the DP sensor to remain fixed in location while the pneumatic module moves. By dividing the air gauge 156 in this manner, the size and mass of the pneumatic module 158 can be reduced, which correspondingly reduces the size and mass of the portion of the air gauge that is moved. This, in turn, allows greater size flexibility of the movable mass and increases accessibility to the DP sensor 160, if needed. Also, a reduced movable mass generally exhibits greater frequency response than a larger movable mass.

Figure 6:
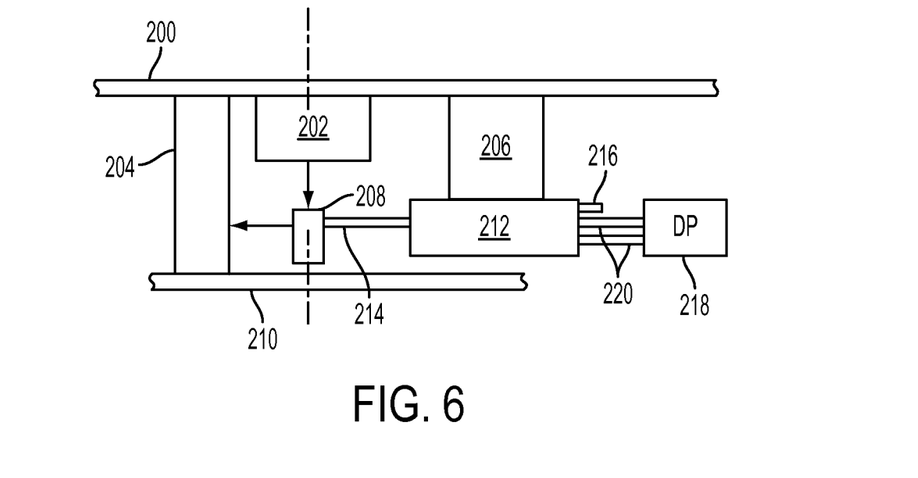
FIG. 6 schematically depicts another embodiment in which the air gauge is divided into fixed and movable portions.

FIG. 6 depicts another embodiment in which the air gauge comprises fixed and movable portions. FIG. 6 depicts the metrology frame 200 to which an actuator 202, a probe-height encoder 204, and a mounting block 206 are mounted. The actuator 202 is coupled to the probe 208, thereby providing up and down motion of the probe as required. The probe 208 detects its height, relative to the wafer 210 using the probe-height encoder 204. The pneumatic module 212 of the air gauge is mounted to the mounting block 206, so the pneumatic module remains stationary. The pneumatic module 212 is coupled to the probe 208 by a flexible conduit 214, but the probe is external to the pneumatic module, which allows the pneumatic module to remain fixed in position while the probe moves up and down. The pneumatic module 212 includes an inlet 216 for pressurized air, but the DP sensor 218 is external to the pneumatic module and coupled to the pneumatic module 212 by flexible conduit 220. This allows the DP sensor 218 to be located remotely for, for example, thermal isolation of the sensor. Thus, the only movable component in this embodiment is the probe 208. By dividing the air gauge in this manner, the size and mass of the pneumatic module are reduced. Also, the movable mass is reduced while frequency response is correspondingly increased. In addition, by pneumatically coupling stationary portions of the air gauge using flexible conduits, ease of replacement and servicing of the portions are improved, as are packaging of multiple DP sensor systems.

Although FIG. 6 shows DP sensors 218 as being separate from the pneumatic module 268, it will be understood that other air-gauge components can be separated in a similar manner from the pneumatic module. These other components include mass-flow sensor(s) and/or variable flow restrictors.

Figure 7:
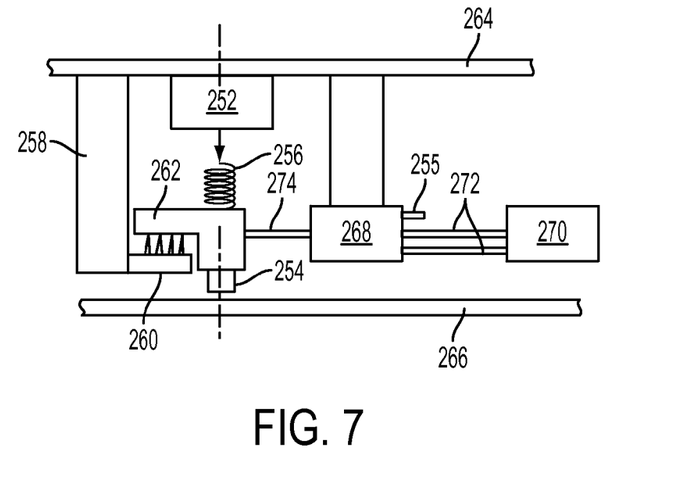
in FIG. 7 the depicted actuator is a force actuator coupled to the probe using a spring. The probe-height encoder of FIG. 6 is replaced with a member terminating with a first extension. The probe includes a complementary second extension that is urged against the first extension at the limit of downward travel of the probe to the use position.

An alternative embodiment to that of FIG. 6 is shown in FIG. 7, in which actuator 252 is a force actuator coupled to the probe 254 using a spring 256. Also, the probe-height encoder 204 of FIG. 6 is replaced with a member 258 terminating with an extension 260. The probe 254 includes a complementary extension 262 that is urged against the extension 260 at the limit of downward travel of the probe. Other parts in FIG. 7 are similar to corresponding parts in the embodiment of FIG. 4, including the metrology frame 264, wafer 266, inlet port 255. The pneumatic module 268 is affixed to the metrology frame 264. The DP sensor 270 can be mounted in a convenient location and coupled to the pneumatic module 268 by flexible conduits 272. The pneumatic module 268 is pneumatically coupled to the probe 254 by a flexible conduit 274. Thus, the probe 254 is movable relative to the pneumatic module 268. By having the probe 254 be movable and the pneumatic module 268 be stationary, the mass that is moved by the actuator 252 is substantially reduced compared to a configuration (e.g., FIG. 4) in which the actuator moves the entire air gauge. Similarly, by separating one or more DP sensors, mass-flow sensors, and/or variable flow restrictors of the air gauge from the pneumatic module 268 and using flexible conduit(s) 272 to connect these separate components to the pneumatic module, the components can be moved relative to the pneumatic module, which eases assembly, adjustability, and serviceability. As in FIG. 4B, additional multiple extensions can be used to control the angular orientation of the probe.

In some embodiments, an actuator used for moving a variable flow restrictor can also be used to effect changes of fluid flow through a restrictor of the air-gauge.

In addition, moving DP sensor(s) away from the pneumatic module and probe of a fluid gauge may reduce the transfer of heat generated by the sensor electronics to the substrate or other thermally sensitive parts.

If the probe is movable to permit lowering thereof to a fixed height relative to the metrology frame, the actual height of the substrate should lie within a designated range to achieve the desired accuracy of height measurements and to ensure that the probe does not collide with the substrate. This is done by making appropriate measurements of the height of the substrate stage. To accomplish this, the thickness (and any wedge) of the substrate must be known at least approximately (to within several micrometers). This can be done using a simple height-measurement sensor while the precision system is undergoing another process step such as substrate loading, field image alignment (FIA), or optical autofocus. Alternatively, the substrate thickness and wedge may be recorded from earlier process steps (e.g., during earlier microlithographic exposures). Further alternatively, the stage can be initially lowered to a height at which the top surface of the thickest substrate will be safely below the tip of the lowered probe; the stage is then stepped up until the probe responds to the presence of the substrate. From the known response of the probe to substrates at different heights, the stage adjusts the substrate height further until the substrate lies within a height range where the probe is known to be accurate.

The fluid gauge system can comprise a single air gauge or multiple air gauges so that multiple substrate heights can be recorded simultaneously. The air gauges can be actuated independently of each other, or they may be rigidly mounted on a sub-metrology frame that is actuated and its height measured.

Figure 8:
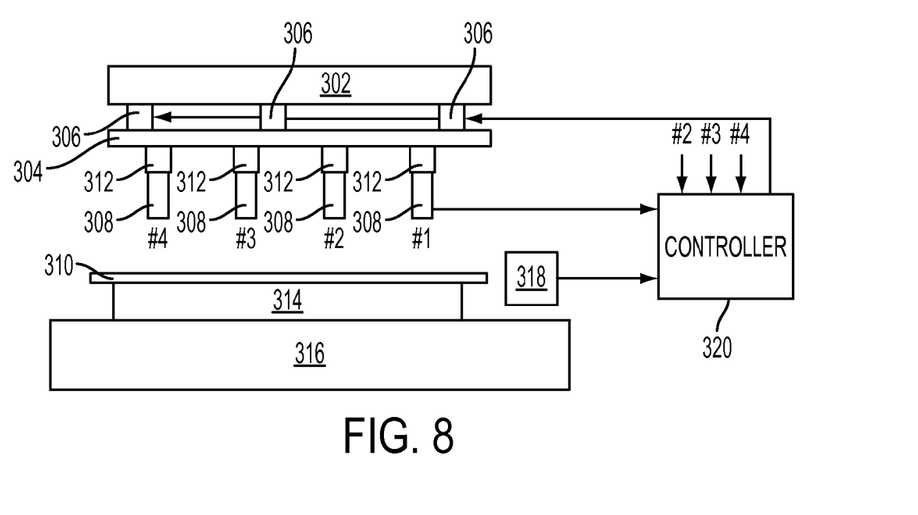
FIG. 8 schematically depicts an embodiment having no active servoing. The embodiment utilizes a sub-metrology plate that is movable relative to the metrology frame using multiple height-adjustment actuators.

Yet another embodiment is shown in FIG. 8, illustrating a system having no active servoing. This embodiment is particularly useful for use in a microlithography system comprising a metrology frame 302 and a projection lens (not shown). Associated with the metrology frame 302 is a sub-metrology member or plate 304 that is positionable relative to the metrology frame 302 using multiple height-adjustment actuators 306 that, in this embodiment, are situated between the metrology frame 302 and the sub-metrology member 304. Preferably at least three actuators 306 are arranged to support the sub-metrology member 304 (e.g., in a tripod manner) relative to the metrology frame 302. The metrology frame 302 is stationary, as discussed above, so the actuators 306 support the sub-metrology member 304 relative to the metrology frame 302. Multiple analog proximity sensors 308 (air-gauges in this embodiment) are situated between the wafer 310 (but not contacting the wafer) and the sub-metrology member 304. The proximity sensors 308 are used for measuring the height of the wafer 310 relative to the sub-metrology member 304, and thus relative to the metrology frame 302, and thus relative to the projection lens. Each air-gauge 308 includes a respective static-height-and-tilt adjustment 312, useful especially at setup for calibrating (as required) the height of the respective air gauge and the tilt of the sub-metrology member 304. The wafer 310 is placed on a wafer chuck 314, which is supported by a wafer stage 316. The height of the stage 316 is determined and monitored by a stage-height monitor 318, and measurement data produced by the stage-height monitor 318 are routed to a controller 320. The stage-height monitor 318 or a separate wafer-height sensor (not shown) is used to adjust the height and angle of the sub-metrology frame 304 relative to the wafer surface, using the height-adjustment actuators 306. The respective outputs from the proximity sensors 308 are utilized by the controller 320 in determining and controlling height of the wafer and in making adjustments, as required, of the position of the sub-metrology member relative to the metrology frame.

The actuators 306 can be force actuators as described above. Alternatively, the actuators 306 can be position actuators. Position actuators desirably include respective height encoders or the like for servoing the positions of the air gauges. Embodiments including either position actuators or force actuators (or both types of actuators) can include respective positive stops for limiting motions of the respective air gauges. The air gauges can be modular or not modular as described above.

The embodiment shown in FIG. 8 does not include means for monitoring, or at least periodically checking, the performance of the air-gauges 308. However, air-gauge monitoring can be achieved by providing on the stage 314 a fixed surface at a fixed (and known) height, or several fixed surfaces at different known heights. The surface is brought as needed under the air gauges to check height. This means of monitoring the height of air-gauges can be applied in any of the other embodiments described above.

Figure 9:
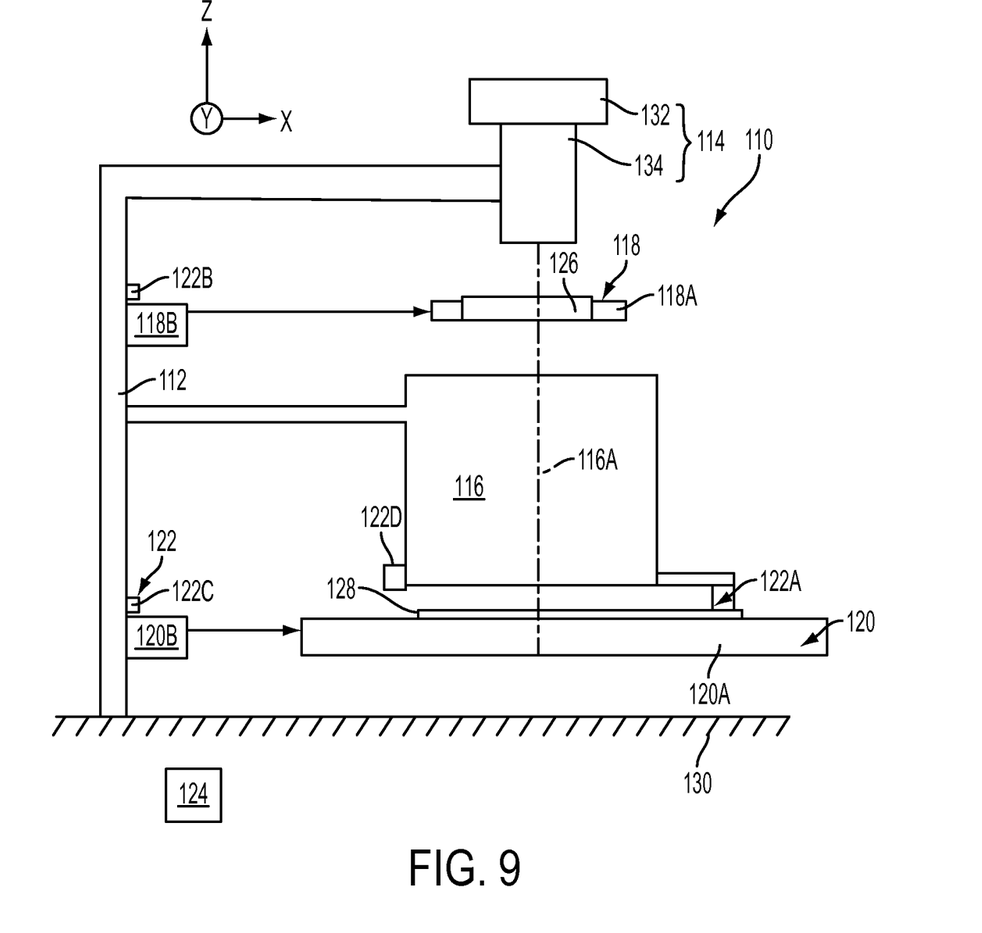
FIG. 9 is a schematic diagram of a microlithographic exposure system, as a representative precision system, including features of the invention described herein.

The methods and apparatus disclosed above can be used in conjunction with various precision systems such as various types of lithography systems and other substrate-processing systems and methods. Turning to FIG. 9, certain features of an immersion lithography system (an exemplary precision system) are shown, namely, a light source 840, an illumination-optical system 842, a reticle stage 844, a projection-optical system 846, and a wafer (substrate) stage 848, all arranged along an optical axis A. The light source 840 is configured to produce a pulsed beam of illumination light, such as DUV light of 248 nm as produced by a KrF excimer laser, DUV light of 193 nm as produced by an ArF excimer laser, or DUV light of 157 nm as produced by an $F_2$ excimer laser. The illumination-optical system 842 includes an optical integrator and at least one lens that conditions and shapes the illumination beam for illumination of a specified region on a patterned reticle 850 mounted to the reticle stage 844. The pattern as defined on the reticle 850 corresponds to the pattern to be transferred lithographically to a wafer 852 that is held on the wafer stage 848. Lithographic transfer in this system is by projection of an aerial image of the pattern from the reticle 850 to the wafer 852 using the projection-optical system 846. The projection-optical system 846 typically comprises many individual optical elements (not detailed) that project the image at a specified demagnification ratio (e.g., 1/4 or 1/5) on the wafer 852. So as to be imprintable, the wafer surface is coated with a layer of a suitable exposure-sensitive material termed a "resist."

The reticle stage 844 is configured to move the reticle 850 at least in the X-direction, Y-direction, and rotationally about the Z-axis. To such end, the reticle stage is equipped with one or more linear motors having cooled coils as described herein. The two-dimensional position and orientation of the reticle 850 on the reticle stage 844 are detected by a laser interferometer or an encoder system (not shown) in real time, and positioning of the reticle 850 is effected by a main control unit on the basis of the detection thus made.

The substrate (e.g., semiconductor wafer) 852 is held by a substrate holder ("chuck," not shown) on the substrate stage 848. The substrate stage 848 includes a mechanism (not shown) for controlling and adjusting, as required, the focusing position (along the Z-axis) and the tilting angle of the substrate 852. The substrate stage 848 also includes electromagnetic actuators (e.g., linear motors or a planar motor, or both) for moving the substrate in the X-Y plane substantially parallel to the image-formation surface of the projection-optical system 846. These actuators desirably comprise linear motors, one more planar motors, or both.

The substrate stage 848 also includes mechanisms for adjusting the tilting angle of the substrate 852 by an auto-focusing and auto-leveling method. Thus, the substrate stage serves to align the substrate surface with the image surface of the projection-optical system. The two-dimensional position and orientation of the substrate are monitored in real time by another laser interferometer (not shown). Control data based on the results of this monitoring are transmitted from the main control unit to a drive circuits for driving the substrate stage. During exposure, the light passing through the projection-optical system is made to move in a sequential manner from one location to another on the substrate, according to the pattern on the reticle in a step-and-repeat or step-and-scan manner.

The projection-optical system 846 normally comprises many lens elements that work cooperatively to form the exposure image on the resist-coated surface of the substrate 852. For convenience, the most distal optical element (i.e., closest to the substrate surface) is an objective lens 853. Since the depicted system is an immersion lithography system, it includes an immersion liquid 854 situated between the objective lens 853 and the surface of the substrate 852. As discussed above, the immersion liquid 854 is of a specified type. The immersion liquid is present at least while the pattern image of the reticle is being exposed onto the substrate.

The immersion liquid 854 is provided from a liquid-supply unit 856 that may comprise a tank, a pump, and a temperature regulator (not individually shown). The liquid 854 is gently discharged by a nozzle mechanism 855 into the gap between the objective lens 853 and the substrate surface. A liquid-recovery system 858 includes a recovery nozzle 857 that removes liquid from the gap as the supply 856 provides fresh liquid 854. As a result, a substantially constant volume of continuously replaced immersion liquid 854 is provided between the objective lens 853 and the substrate surface. The temperature of the liquid is regulated to be approximately the same as the temperature inside the chamber in which the lithography system itself is situated.

Also shown is a sensor window 860 extending across a recess 862, defined in the substrate stage 848, in which a sensor 864 is located. Thus, the window 860 sequesters the sensor 864 in the recess 862. Movement of the substrate stage 848 so as to place the window 860 beneath the objective lens 853, with continuous replacement of the immersion fluid 854, allows a beam passing through the projection-optical system 846 to transmit through the immersion fluid and the window 860 to the sensor 864.

A fringe-projection system 880 is situated to project fringes to the substrate 852 and a reference surface, and a detection system 882 is configured to detect a portion of the fringe pattern. The detected beam can be used as described above to assess focus so that suitable system adjustments can be made to correct, prevent, or at least partially compensate focus shifts. Similar principles are also applicable to AF sensors used in liquid-immersion type exposure apparatus, for example, as disclosed in U.S. Patent Application Publication No. 2011/0086315, incorporated herein by reference.

The embodiments described herein can also be used in combination with the AF sensor configured to reduce errors due to reflecting surfaces as disclosed, for example, in U.S. Patent Application Publication No. 2009/0116039, and U.S. Pat. No. 8,149,382, both being incorporated herein by reference.

In the system configurations described above, a light-transmissive type mask (reticle) is used, which is obtained by forming a predetermined light-shielding pattern (or a phase pattern or a light-attenuation pattern) on a light-transmitting substrate. Instead of this reticle, as disclosed in, for example, U.S. Pat. No. 6,778,257, an electron mask (which is also called a variable shaped mask, an active mask, or an image generator, and includes, for example, a DMD (Digital Micromirror Device). A DMD is a type of non-emission type image-display element (spatial light modulator or the like). On the DMD a light-transmitting pattern, a reflection pattern, or an emission pattern is formed according to electronic data of the pattern that is to be exposed. In the case of using such a variable shaped mask, a stage on which a workpiece (e.g., a wafer, a glass plate, or the like) is mounted is scanned relative to the variable shaped mask. The equivalent effect to the embodiment above can be obtained by measuring the position of this workpiece using the autofocus system.

Further, as disclosed in, for example, PCT International Publication No. 2001/035168, incorporated herein by reference, the embodiments described herein can also be applied to an exposure apparatus (a lithography system) in which line-and-space patterns are formed on the wafer W by forming interference fringes on the substrate 110.

The embodiments described above can also be applied to an exposure apparatus that synthesizes two reticle patterns on a substrate via a projection optical system and substantially simultaneously performs double-exposure of one shot area on the substrate by one scanning exposure, as disclosed in, for example, U.S. Pat. No. 6,611,316, incorporated herein by reference.

The object or workpiece on which a pattern is to be formed (an object subject to exposure on which an energy beam is irradiated) is not limited to a wafer, but may be any of various other objects and workpieces such as a glass plate, a ceramic substrate, a film member, or a mask blank.

The usage of the exposure apparatus is not limited to exposure apparatus used for manufacturing semiconductor devices. Such usage can also be applied widely to, for example, an exposure apparatus for manufacturing liquid-crystal display elements, in which a pattern for liquid-crystal display elements is transferred onto a rectangular glass plate, and to an exposure apparatus for manufacturing organic EL, thin-film magnetic heads, imaging devices (such as CCDs), micromachines, DNA chips or the like. The exposure apparatus can also be of a type that transfers a circuit pattern onto a glass substrate, a silicon wafer, or the like, not only for producing microdevices such as semiconductor devices, but also for producing a reticle or a mask used in an exposure apparatus such as an optical exposure apparatus, an EUV exposure apparatus, an X-ray exposure apparatus, or an electron-beam exposure apparatus.

Exposure systems incorporating height-measurement embodiments as described above are manufactured by assembling various sub-systems containing their respective components, so as to maintain predetermined mechanical accuracy, electrical accuracy, and optical accuracy. For ensuring these various accuracies, the following adjustments are carried out before and after the assembling: adjustment for achieving the specified optical accuracy for various optical systems; adjustment for achieving the specified mechanical accuracy for various mechanical systems; and adjustments for achieving the specified electrical accuracy for various electrical systems. The assembling steps from the various subsystems into the exposure apparatus include mechanical connections, wire connections of electric circuits, conduit connections of pneumatic circuits, etc., between the various subsystems. The individual subsystems are assembled before performing assembling steps from the various subsystems into the exposure apparatus. After completing the assembly from the various subsystems into an exposure apparatus, overall adjustment is carried out to ensure various specified performance accuracies for the entire exposure apparatus. The manufacture of exposure apparatus is desirably performed in a clean room in which the temperature, cleanliness, etc., are controlled.

The respective disclosures of all publications, PCT International Publications, U.S. patent application Publications, and U.S. patents that are cited in the description so far related to exposure apparatus and the like are each incorporated herein by reference to the fullest extent allowed by law.

An exemplary process for manufacturing semiconductor devices, including an exposure step, is shown in FIG. 9. Such methods can also include identification and correction of autofocus errors, as described above. In step 901 the device's function and performance characteristics are designed. Next, in step 902, a mask (reticle) having a desired pattern is designed according to the previous designing step, and in a parallel step 903 a wafer is made from a suitable semiconductor material. The mask pattern designed in step 902 is exposed onto the wafer from step 903 in step 904 by a microlithography system having an AF system such as disclosed herein. In step 905 the semiconductor device is assembled (including the dicing process, bonding process, and packaging process). Finally, the device is inspected in step 906.

Figure 10:
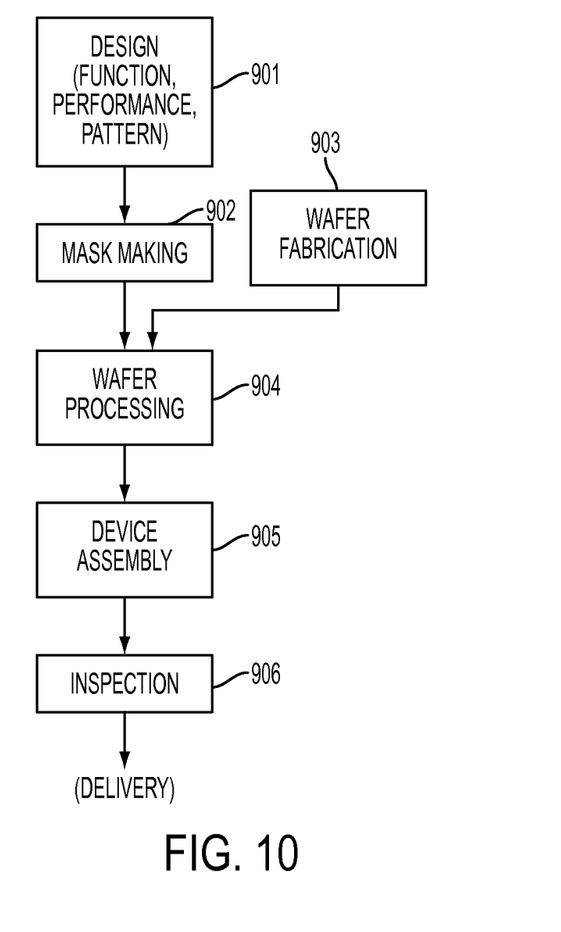
FIG. 10 is a flow-chart outlining a process for manufacturing a semiconductor device in accordance with the invention.
Figure 11:
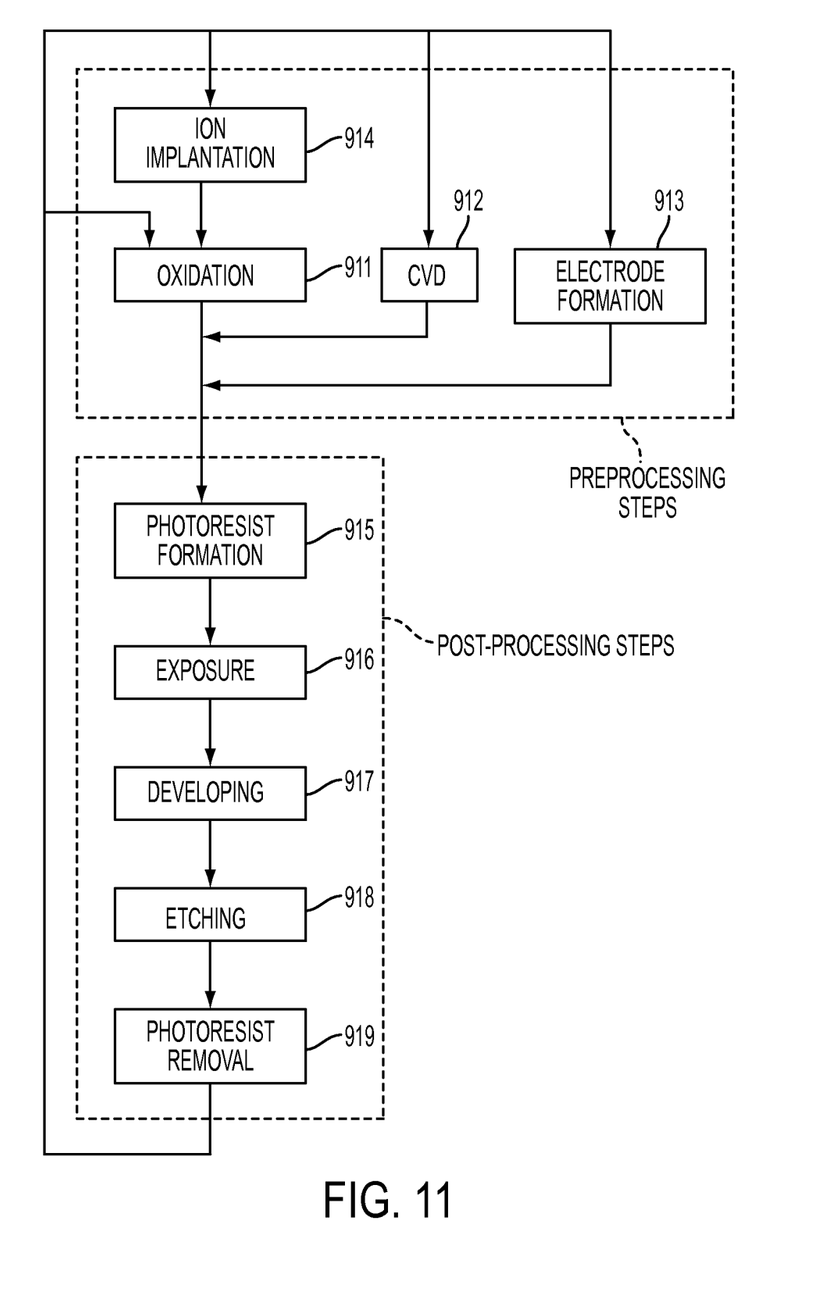
FIG. 11 is a flow-chart of a portion of a device-manufacturing process in more detail.

FIG. 10 is a flowchart of the above-mentioned step 904 in the case of fabricating semiconductor devices. In FIG. 10, in step 911 (oxidation step), the wafer surface is oxidized. In step 912 (CVD step), an insulation film is formed on the wafer surface. In step 913 (electrode-formation step), electrodes are formed on the wafer by vapor deposition. In step 914 (ion-implantation step), ions are implanted in the wafer. The above-mentioned steps 911-914 constitute the preprocessing steps for wafers during wafer processing, and selection is made at each step according to processing requirements.

At each stage of wafer processing, when the above-mentioned preprocessing steps have been completed, the following "post-processing" steps are implemented: First, in step 915 (photoresist-formation step), photoresist is applied to a wafer. Next, in step 916 (exposure step), the above-mentioned exposure device is used to transfer the circuit pattern of a mask (reticle) to a wafer. Then, in step 917 (developing step), the exposed wafer is developed, and in step 918 (etching step), parts other than residual photoresist (exposed material surface) are removed by etching. In step 919 (photoresist-removal step), unnecessary photoresist remaining after etching is removed. Multiple circuit patterns are fainted by repeating these pre-processing and post-processing steps.

In view of the many possible embodiments to which the principles of the disclosure may be applied, it should be recognized that the illustrated embodiments are only preferred examples and should not be taken as limiting the scope of the invention.

We claim:

1. In a precision system having a fixed metrology member, an apparatus for measuring position of an object surface along an axis, the apparatus comprising:
   at least one actuator coupled to the fixed metrology member;
   at least one analog proximity sensor coupled to the at least one actuator, the at least one actuator being controllably operated to position the at least one proximity sensor at a fixed distance along the axis from a surface that is fixed relative to the fixed metrology member, wherein the at least one analog proximity sensor includes a movable first portion coupled to the at least one actuator so as to be movable by the at least one actuator and a fixed second portion coupled to the fixed metrology member, the first portion and the second portions being pneumatically coupled to each other; and
   a controller coupled to the actuator and to the proximity sensor, the controller being configured to compute a position of the object surface along the axis based on a known location of the fixed surface along the axis, the fixed distance from the fixed surface, and position signals from the at least one proximity sensor.

2. The apparatus of claim 1, wherein the axis is a height axis.

3. The apparatus of claim 1, wherein the controller is configured to move the proximity sensor from a retract position to a use position relative to the object surface and from the use position to the retract position.

4. The apparatus of claim 1, wherein the proximity sensor comprises an air gauge.

5. The apparatus of claim 1, wherein:
   the precision system is a microlithography system;
   the fixed metrology member is a respective portion of a reference frame of the microlithography system;
   the object is a lithographic substrate, and
   the surface that is fixed relative to the reference member is an exposure surface of the lithographic substrate.

6. The apparatus of claim 1, wherein the at least one actuator is coupled to the respective at least one proximity sensor in the manner of a position actuator.

7. The apparatus of claim 6, further comprising a respective encoder situated relative to the at least one proximity sensor to monitor position of the respective proximity sensor in the axis direction.

8. The apparatus of claim 1, wherein the at least one actuator is coupled to the respective proximity sensor in the manner of a force actuator.

9. The apparatus of claim 8, further comprising a respective compression spring situated between the at least one actuator and respective proximity sensor.

10. The apparatus of claim 9, wherein:
the at least one proximity sensor includes at least one first positive stop;
the fixed metrology member includes at least one second positive stop configured to engage the first positive stop whenever the respective actuator has moved the respective proximity sensor to a use position.

11. The apparatus of claim 10, wherein the first and second positive stops define respective contact surfaces that, when contacting each other, result in placement of the at least one proximity sensor at the use position at which the at least one proximity sensor measures a position of the object surface.

12. The apparatus of claim 11, wherein:
multiple proximity sensors define multiple respective first positive stops;
the fixed metrology member includes multiple second positive stops corresponding to the respective first positive stops; and
whenever the proximity sensors are at the use position, the first positive stops engaging the respective second positive stops prevent axial misalignment of the proximity sensors.

13. The apparatus of claim 1, wherein the at least one proximity sensor is modular.

14. The apparatus of claim 13, wherein:
the at least one proximity sensor comprises a respective air gauge;
the fixed second portion comprises a pneumatic module of the air gauge; and
the movable first portion comprises a probe of the air gauge.

15. The apparatus of claim 13, wherein:
the at least one proximity sensor comprises a respective air gauge;
the fixed second portion comprises a DP sensor of the air gauge; and
the movable second portion comprises a pneumatic module of the air gauge.

16. The apparatus of claim 1, further comprising:
multiple actuators; and
multiple analog proximity sensors each corresponding to a respective actuator.

17. The apparatus of claim 16, wherein the actuators are respective force actuators.

18. The apparatus of claim 16, wherein the actuators are respective position actuators.

19. The apparatus of claim 16, further comprising a sub-metrology member coupled via the actuators to the fixed metrology member so as to be movable and tiltable relative to the fixed metrology member, wherein the analog proximity sensors are coupled to the sub-metrology member so as to be collectively movable and tiltable with corresponding movements and tilts of the sub-metrology member.

20. The apparatus of claim 19, wherein the analog proximity sensors are coupled to the sub-metrology member via respective static height-and-tilt adjustments.

21. A microlithography system, comprising the apparatus of claim 19, wherein the fixed metrology member is a component of a metrology frame of the system, the object is a lithographic substrate exposed by the system, and the axis is a height axis of the system.

22. A microlithography system, comprising the apparatus of claim 16, wherein the fixed metrology member is a component of a metrology frame of the system, the object is a lithographic substrate exposed by the system, and the axis is a height axis of the system.

23. A microlithography system, comprising the apparatus of claim 1, wherein the fixed metrology member is a member of a metrology frame of the system, and the object is a lithographic substrate exposed by the system, and the axis is a height axis of the system.

24. A manufacturing process, comprising a microlithography step performed using a microlithography system as recited in claim 23.

* * * * *